US011315783B2

(12) United States Patent
Ding et al.

(10) Patent No.: US 11,315,783 B2
(45) Date of Patent: Apr. 26, 2022

(54) METHOD OF FABRICATING DISPLAY SUBSTRATE, DISPLAY SUBSTRATE, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Yuankui Ding, Beijing (CN); Heekyu Kim, Beijing (CN); Liangchen Yan, Beijing (CN); Ce Zhao, Beijing (CN); Bin Zhou, Beijing (CN); Yingbin Hu, Beijing (CN); Wei Song, Beijing (CN); Dongfang Wang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 331 days.

(21) Appl. No.: 16/487,552

(22) PCT Filed: Feb. 20, 2019

(86) PCT No.: PCT/CN2019/075585
§ 371 (c)(1),
(2) Date: Aug. 21, 2019

(87) PCT Pub. No.: WO2020/057053
PCT Pub. Date: Mar. 26, 2020

(65) Prior Publication Data
US 2021/0335604 A1 Oct. 28, 2021

(30) Foreign Application Priority Data

Sep. 20, 2018 (CN) .......................... 201811100151.9

(51) Int. Cl.
*H01L 21/02* (2006.01)
*H01L 27/12* (2006.01)
(52) U.S. Cl.
CPC .. *H01L 21/02271* (2013.01); *H01L 21/02164* (2013.01); *H01L 21/02315* (2013.01); (Continued)
(58) Field of Classification Search
CPC .......... H01L 21/02271; H01L 27/1259; H01L 21/02315; H01L 21/02164; H01L 27/124; H01L 27/1248
See application file for complete search history.

(56) References Cited

U.S. PATENT DOCUMENTS

| 6,362,507 B1* | 3/2002 | Ogawa ................ H01L 27/1255 257/350 |
| 2002/0042167 A1* | 4/2002 | Chae .................... H01L 27/124 438/149 |

(Continued)

*Primary Examiner* — Selim U Ahmed
*Assistant Examiner* — Evan G Clinton
(74) *Attorney, Agent, or Firm* — Intellectual Valley Law, P.C.

(57) ABSTRACT

A method of fabricating a display substrate is provided. The method includes forming a conductive layer on a base substrate; and performing a chemical vapor deposition process to form an oxide layer on a side of an exposed surface of the conductive layer away from the base substrate, the exposed surface of the conductive layer including copper, the oxide layer formed to include an oxide of a target element M. The chemical vapor deposition process is performed using a mixture of a first reaction gas including oxygen and a second reaction gas including the target element M, at a reaction temperature in a range of 200 Celsius degrees to 280 Celsius degrees. A mole ratio of oxygen element to the target element M in the mixture of the first reaction gas and the second reaction gas is in a range of 40:1 to 60:1.

16 Claims, 7 Drawing Sheets

(52) U.S. Cl.
CPC ........ *H01L 27/1259* (2013.01); *H01L 27/124* (2013.01); *H01L 27/1248* (2013.01)

(56) References Cited

U.S. PATENT DOCUMENTS

| | | | |
|---|---|---|---|
| 2006/0284317 A1* | 12/2006 | Ito | H01L 21/76846 257/751 |
| 2011/0076422 A1* | 3/2011 | Stowell | C23C 16/511 427/575 |
| 2012/0218325 A1* | 8/2012 | Hiroki | H04N 13/398 345/697 |
| 2016/0043101 A1* | 2/2016 | Liu | H01L 27/1225 257/43 |
| 2017/0372946 A1* | 12/2017 | Peidous | H01L 21/02634 |
| 2020/0286929 A1* | 9/2020 | Li | H01L 21/022 |

\* cited by examiner

| Forming a conductive layer on a base substrate |

↓

| Cleaning the exposed surface of the conductive layer using a protective plasma |

↓

| Chemical vapor depositing an oxide layer on a side of an exposed surface of the conductive layer away from the base substrate |

METHOD OF FABRICATING DISPLAY SUBSTRATE, DISPLAY SUBSTRATE, AND DISPLAY APPARATUS

CROSS-REFERENCE TO RELATED APPLICATION

This application is a national stage application under 35 U.S.C. § 371 of International Application No. PCT/CN2019/075585, filed Feb. 20, 2019, which claims priority to Chinese Patent Application No. 201811100151.9, filed Sep. 20, 2018, the contents of which are incorporated by reference in the entirety.

TECHNICAL FIELD

The present invention relates to display technology, more particularly, to a method of fabricating a display substrate, a display substrate, and a display apparatus.

BACKGROUND

Copper has a resistivity lower than the resistivity of aluminum, therefore the conductive layers (e.g. source electrode, drain electrode, gate, signal lines) of a display substrate are usually made of copper.

SUMMARY

In one aspect, the present invention provides a method of fabricating a display substrate, comprising forming a conductive layer on a base substrate; and performing a chemical vapor deposition process to form an oxide layer on a side of an exposed surface of the conductive layer away from the base substrate, the exposed surface of the conductive layer comprising copper, the oxide layer formed to comprise an oxide of a target element M wherein the chemical vapor deposition process is performed using a mixture of a first reaction gas comprising oxygen and a second reaction gas comprising the target element M, at a reaction temperature in a range of 200 Celsius degrees to 280 Celsius degrees; and a mole ratio of oxygen element to the target element M in the mixture of the first reaction gas and the second reaction gas is in a range of 40:1 to 60:1.

Optionally, prior to performing the chemical vapor deposition process, the base substrate having the conductive layer is not pre-heated.

Optionally, prior to performing the chemical vapor deposition process, the method further comprises pre-heating the base substrate having the conductive layer for a duration no more than 5 seconds.

Optionally, the chemical vapor deposition process is performed at a power in a range of 4 kw to 12 kw, and at an atmosphere pressure in a range of 0.7 mtorr to 1.3 mtorr.

Optionally, prior to performing the chemical vapor deposition process, the method further comprises cleaning the exposed surface of the conductive layer using a protective plasma.

Optionally, cleaning the exposed surface of the conductive layer using the protective plasma is performed for a duration in a range of 5 seconds to 30 seconds.

Optionally, the protective plasma comprises nitrogen, argon, or a combination of nitrogen and argon.

Optionally, a flow of the protective plasma comprises the protective gas is in a range of 30000 sccm to 50000 sccm.

Optionally, the target element M is silicon, and the oxide layer comprises $SiO_x$, $0<x\leq2$.

Optionally, the first reaction gas comprises $N_2O$, and the second reaction gas comprises $SiH_4$.

Optionally, the conductive layer is a layer selected from a group consisting of a gate electrode of a thin film transistor, a gate line, a source electrode of a thin film transistor, a drain electrode of a thin film transistor, a data line, and a common electrode signal line.

Optionally, the conductive layer comprises a gate electrode and a gate line connected to the gate electrode, the gate electrode and the gate line formed in a same layer; and the oxide layer comprises an inter-layer dielectric layer in direct contact with the gate electrode and the gate line.

Optionally, the conductive layer comprises a source electrode, a drain electrode, and a data line connected to the source electrode, the source electrode, the drain electrode, and the data line formed in a same layer; and the oxide layer comprises a protective layer in direct contact with the source electrode, the drain electrode, and the data line.

Optionally, forming the conductive layer comprises forming a first sub-layer and forming a second sub-layer on a side of the first sub-layer away from the base substrate, the exposed surface of the conductive layer being an exposed surface of the second sub-layer, the second sub-layer is formed to comprise copper; and the first sub-layer comprises a Molybdenum-Niobium alloy or a Molybdenum-Titanium alloy.

In another aspect, the present invention provides a display substrate fabricated by a method described herein.

In another aspect, the present invention provides a display substrate described herein, and one or more integrated circuits connected to the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Active metals such as copper are prone to be oxidized. When an oxygen-containing insulating layer is deposited on a metallic conductive layer, the surface of the metallic conductive layer in direct contact with the oxide layer can be easily oxidized, adversely affecting the electrical performance of the metallic conductive layer, particularly when the conductive layer is made of a relatively active metal such as copper.

Figure 1:
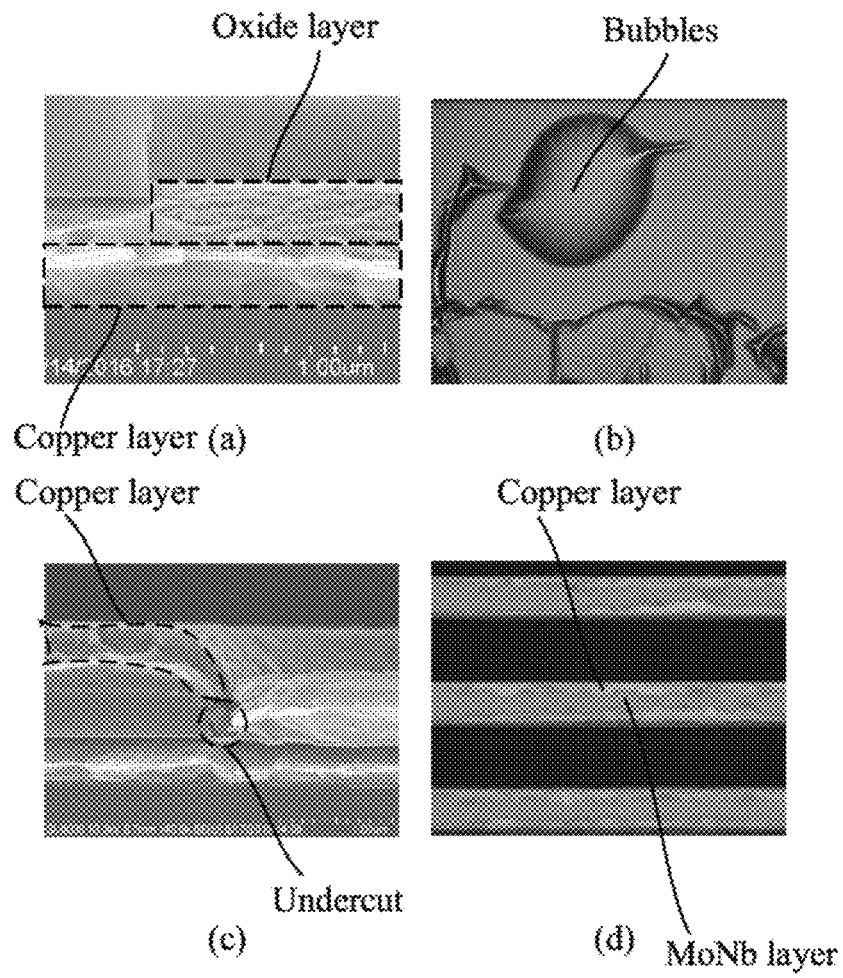
FIG. 1 is a schematic diagram illustrating defects of a conductive layer in some embodiments according to the present disclosure.

FIG. 1 is a schematic diagram illustrating defects of a conductive layer in some embodiments according to the present disclosure. Referring to part (a) of FIG. 1, an oxide layer is deposited on a surface of a copper layer, copper atoms of the surface of the copper layer react with oxygen of the oxide layer and form a copper oxide layer, adversely affecting the electrical performance of the conductive layer (e.g. copper layer).

In some embodiments, a copper layer is deposited on a surface of a molybdenum-niobium (MoNb) layer to form a conductive layer. A SiNy insulating layer and a $SiO_x$ insulating layer ($0<x\leq2$) are sequentially formed on the conductive layer having the copper layer and the MoNb layer.

In one example, the SiNy insulating layer is in direct contact with the copper layer, the copper layer cannot be oxidized. In another example, the conductive layer including the copper layer is a gate electrode of a thin film transistor (TFT). The SiNy insulating layer also covers an active layer. The SiNy insulating layer is formed using a gas including ammonia ($NH_3$). The gas of ammonia includes hydrogen atoms. During the process of forming SiNy insulating layer, hydrogen atoms are introduced into the active layer. Over-hydrogenation of the active layer may affect the electrical performance of the TFT. In addition, due to the limitations of fabricating TFT, the copper layer may have defects on surface of the copper layer. After a dry etching process, there will also be undercut on the copper layer, and the adhesion between the copper layer and the SiNy insulating layer is poor.

In some embodiments, referring to part (b) of FIG. 1, the surface of the copper layer has bubbles, which may lead to a lower adhesion between the copper layer and a layer in direct contact with the surface of the copper layer.

In some embodiments, referring to part (c) of FIG. 1, the copper layer has an undercut.

Figure 2:
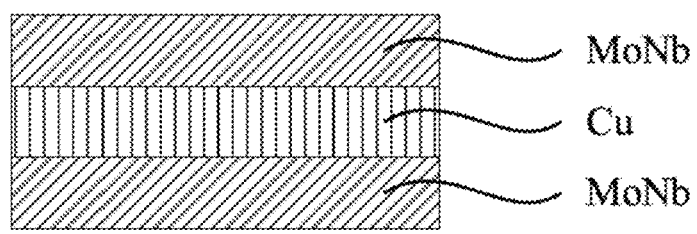
FIG. 2 is a schematic diagram illustrating a structure of conductive layer in some embodiments according to the present disclosure.

FIG. 2 is a schematic diagram illustrating a structure of conductive layer in some embodiments according to the present disclosure. Referring to FIG. 2, to prevent a copper layer from being oxidized by the oxide layer, a conductive layer including the copper layer is design to be a multiple-layer structure. For example, a first layer is a MoNb layer, a second layer is a copper layer, and a third layer is a MoNb layer. The second layer (e.g. copper layer) is between the first layer (e.g. MoNb layer) and the third layer (e.g. MoNb layer). During the process of depositing the oxide layer (e.g. $SiO_x$, $0<x\leq2$), the first layer and the third layer may prevent the second layer (e.g. copper layer) from being oxidized. This multiple-layer structure is complicated and cannot achieve mass production. Moreover, during a dry etching process, a reacting rate of MoNb reacting with an etching solution is faster than a reacting rate of copper reacting with the same etching solution. The MoNb will be etched to expose the copper layer, and the MoNb layer cannot effectively protect the copper layer.

Referring to part (d) of FIG. 1, a MoNb layer has a top MoNb Shrink, which means a portion of the copper layer under the MoNb layer is exposed, and the exposed portion of the copper layer may be oxidized by an oxide layer.

Figure 3:
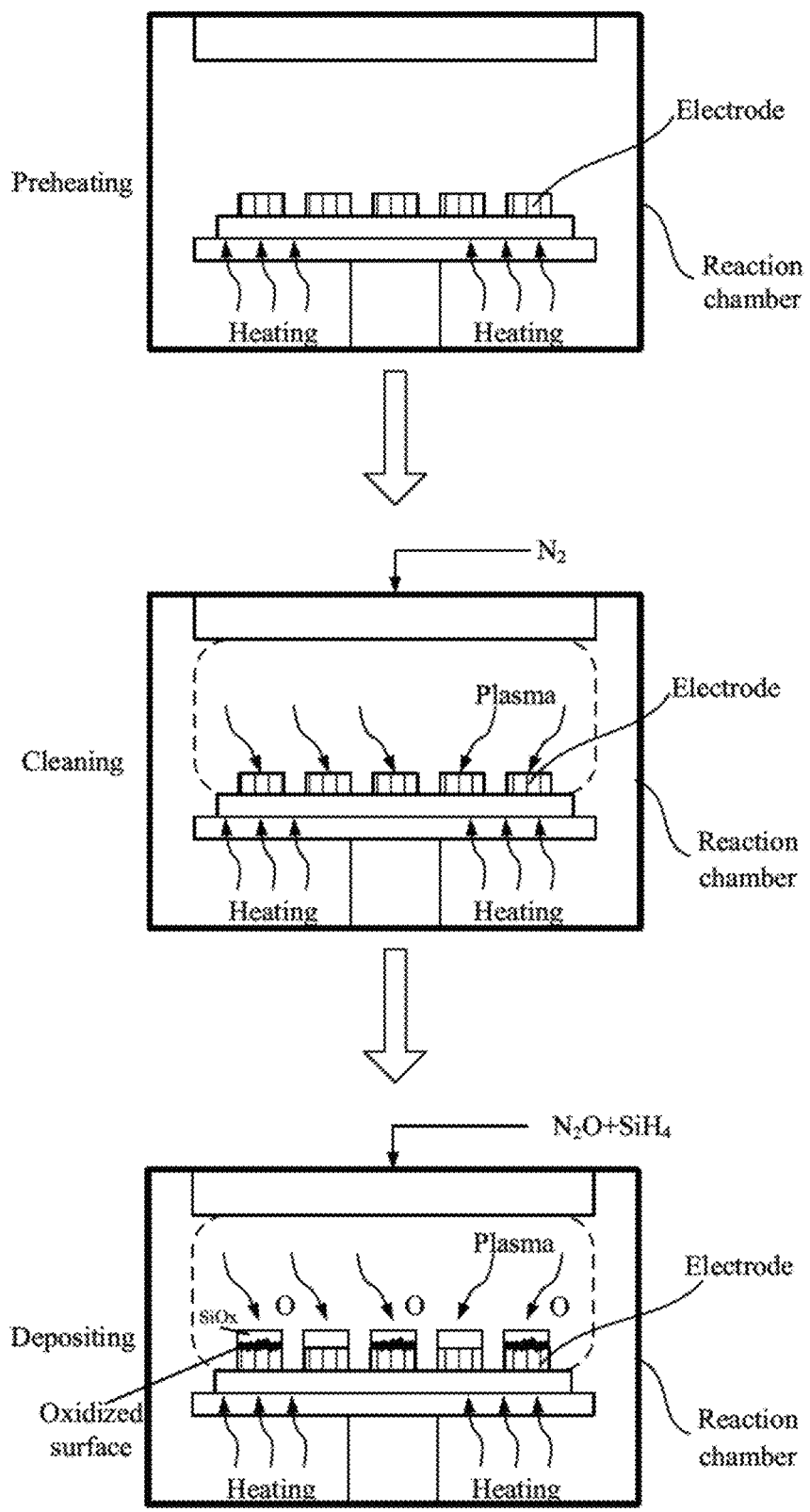
FIG. 3 is a schematic diagram illustrating a process of copper oxidation in some embodiments according to the present disclosure.

FIG. 3 is a schematic diagram illustrating a process of copper oxidation in some embodiments according to the present disclosure. Referring to FIG. 3, in some embodiments, before depositing $SiO_x$ ($0<x\leq2$), an electrode is pre-heated. Subsequently, a surface of the electrode is cleaned using a nitrogen ($N_2$) plasma to remove impurities such as water, and organic materials from the surface of the electrode. Subsequently, a reaction gas including $N_2O$ and $SiH_4$ is introduced into a reaction chamber, the $N_2O$ and $SiH_4$ react at a reaction temperate to form $SiO_x$($0<x\leq2$) on the surface of the electrode.

Copper is relatively sensitive to water and oxygen. Especially when the temperature is high and the copper is in direct contact with an oxygen-containing plasma including nitrogen atoms and oxygen atoms, the reactivity between oxygen atoms, nitrogen atoms, and copper atoms is enhanced. The surface of the electrode (copper electrode) can be easily oxidized and nitrided. The adhesion between the surface of the electrode, being oxidized and nitrided, and a layer in direct contact with the surface of the electrode is decreased, which may affect the product yield.

Accordingly, the present disclosure provides, inter alia, a method of fabricating a display substrate, a display substrate fabricated by a method thereof and a display apparatus that substantially obviate one or more of the problems due to limitations and disadvantages of the related art. In one aspect, the present disclosure provides a method of fabricating a display substrate. The method includes forming a conductive layer on a base substrate; and performing a chemical vapor deposition process to form an oxide layer on a side of an exposed surface of the conductive layer away from the base substrate. Optionally, the exposed surface of the conductive layer includes copper. Optionally, the oxide layer is formed to include an oxide of a target element M. Optionally, the chemical vapor deposition process is performed using a mixture of a first reaction gas including oxygen and a second reaction gas including the target element M at a reaction temperature in a range of 200

Celsius degrees to 280 Celsius degrees. Optionally, a mole ratio of oxygen element to the target element M in the mixture of the first reaction gas and the second reaction gas is in a range of 40:1 to 60:1.

Figure 4:
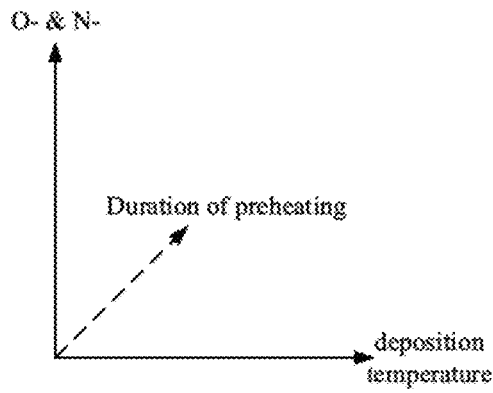
FIG. 4 is a schematic diagram illustrating parameters affecting copper oxidation in some embodiments according to the present disclosure.

FIG. 4 is a schematic diagram illustrating parameters affecting copper oxidation in some embodiments according to the present disclosure. Referring to FIG. 4, parameters affecting copper oxidation includes deposition temperature (e.g. thermal effect), duration of preheating, oxygen-containing group (O—), and nitrogen-containing group (N—).

Figure 5:
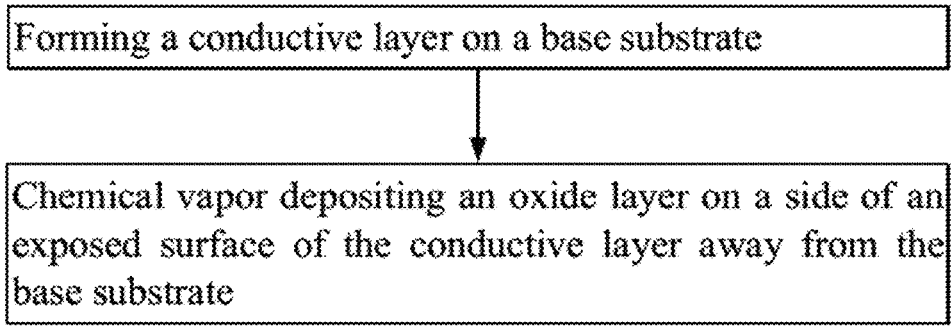
FIG. 5 is a flow chart illustrating a method of fabricating a display substrate in some embodiments according to the present disclosure.

FIG. 5 is a flow chart illustrating a method of fabricating a display substrate in some embodiments according to the present disclosure. Referring to FIG. 5, in some embodiments, a method of fabricating a display substrate includes forming a conductive layer on a base substrate; and performing a chemical vapor deposition process to form an oxide layer on a side of an exposed surface of the conductive layer away from the base substrate. Optionally, prior to performing the chemical vapor deposition process, the base substrate having the conductive layer is no pre-heated. When the conductive layer is heated, the copper of the exposed surface of the conducive layer becomes active. To prevent the copper from being active, the heating process should be avoided.

Figure 6:
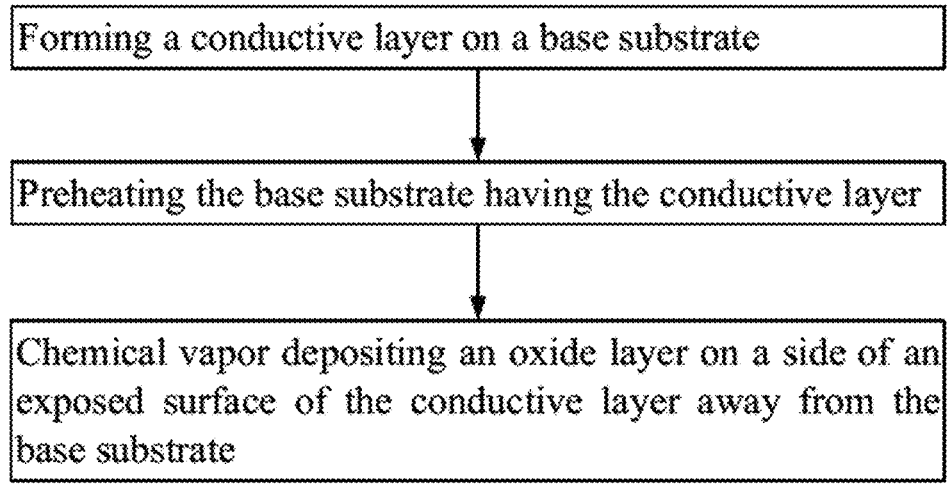
FIG. 6 is a flow chart illustrating a method of fabricating a display substrate in some embodiments according to the present disclosure.

FIG. 6 is a flow chart illustrating a method of fabricating a display substrate in some embodiments according to the present disclosure. Referring to FIG. 6, in some embodiments, prior to performing the chemical vapor deposition process, the method further includes pre-heating the base substrate having the conductive layer for a duration no more than 5 seconds. Because an amount of heat obtained within 5 seconds is insufficient for the heat to transfer from the base substrate to the copper of the exposed surface of the conductive layer. It is unlikely that the copper on the exposed surface of the conductive layer becomes active after the base substrate is heated for 5 seconds.

Optionally, the exposed surface of the conductive layer includes copper. Optionally, the oxide layer is formed to include an oxide of a target element M. Optionally, the chemical vapor deposition process is performed using a mixture of a first reaction gas including oxygen, and a second reaction gas including the target element M.

In some embodiments, the oxide layer is a silicon oxide layer. The second reaction gas including the target element M is a second reaction gas including silicon, and the target element M is silicon. For example, the second reaction gas including silicon is a gas including silane ($SiH_4$). The first reaction gas including oxygen is a first reaction gas including nitrogen oxide ($N_2O$).

The reaction process between silane ($SiH_4$) and nitrogen oxide ($N_2O$) is as follows:

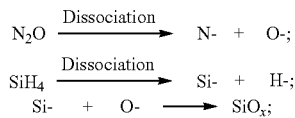

In a dissociation process, nitrogen oxide ($N_2O$) is converted into oxygen ion (O—), and nitrogen ion (N—). In a dissociation process, silane ($SiH_4$) is converted into silicon ion (Si—), and hydrogen ion (H—). Silicon ion (Si—) and oxygen ion (O—) combine into $SiO_x$ ($0<x\leq2$), which deposits on the exposed surface of the conductive layer. The remaining by-products are extracted out of the reaction chamber with the atmosphere.

Optionally, the chemical vapor deposition process is performed at a reaction temperature in a range of 200 Celsius degrees to 280 Celsius degrees, e.g. 200 Celsius degrees to 210 Celsius degrees, 210 Celsius degrees to 220 Celsius degrees, 220 Celsius degrees to 230 Celsius degrees 0.230 Celsius degrees to 240 Celsius degrees, 240 Celsius degrees to 250 Celsius degrees, 250 Celsius degrees to 260 Celsius degrees, 260 Celsius degrees to 270 Celsius degrees, and 270 Celsius degrees to 280 Celsius degrees. For example, the chemical vapor deposition is performed at a reaction temperature lower than 320 Celsius degrees, the thermal effects can be reduced during the chemical vapor deposition.

Optionally, a mole ratio of oxygen element to the target element M in the mixture of the first reaction gas and the second reaction gas is in a range of 40:1 to 60:1, e.g. 40:1 to 45:1, 45:1 to 50:1, 50:1 to 55:1, and 55:1 to 60:1. Optionally, the mole ratio of oxygen element to the target element M in the mixture of the first reaction gas and the second reaction gas is smaller than 80:1. Reducing the mole ratio of oxygen element to the target element M in the mixture of the first reaction gas and the second reaction gas may reduce the chance that copper contacts with the oxygen-containing group (O—).

Optionally, the chemical vapor deposition process is performed at a power in a range of 4 kw to 12 kw, e.g. 4 kw to 6 kw, 6 kw to 8 kw, 8 kw to 10 kw, and 10 kw to 12 kw. For example, to deposit an oxide layer including silicon oxide, the power used by electrodes in the chemical vapor deposition reaction chamber can be reduced to the range of 4 kw-12 kw.

Optionally, the chemical vapor deposition process is performed at an atmosphere pressure in a range of 0.7 mtorr to 1.3 mtorr, e.g., 0.7 mtorr to 0.9 mtorr, 0.9 mtorr to 1.1 mtorr, and 1.1 mtorr to 1.3 mtorr. For example, to deposit an oxide layer including silicon, the atmosphere pressure in the chemical vapor deposition reaction chamber can be reduced to a range of 0.7 mtorr to 1.3 mtorr to lower the cost of the chemical vapor deposition process.

Figure 7:
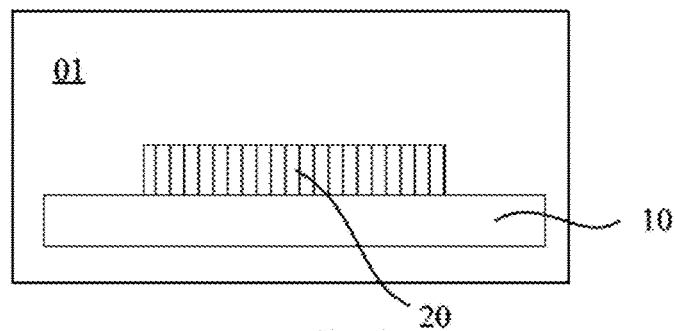
FIG. 7 is a schematic diagram illustrating a structure of a display substrate in some embodiment according to the present disclosure.

FIG. 7 is a schematic diagram illustrating a structure of a display substrate in some embodiment according to the present disclosure. Referring to FIG. 7, in some embodiments, a conductive layer 20 is formed on a base substrate 10. Optionally, the conductive layer 20 is made of copper. Examples of metals for making the conductive layer 20 further include aluminum, nickel, zinc, iron, lead, tin, molybdenum, tungsten, as well as various other transition metals.

In some embodiments, forming the conductive layer includes forming a first sub-layer and forming a second sub-layer on a side of the first sub-layer away from the base substrate. For example, the exposed surface of the conductive layer is an exposed surface of the second sub-layer. Optionally, the second sub-layer is formed to include copper. The first sub-layer includes a Molybdenum-Niobium (MoNb) alloy or a Molybdenum-Titanium (MoTi) alloy.

Figure 8:
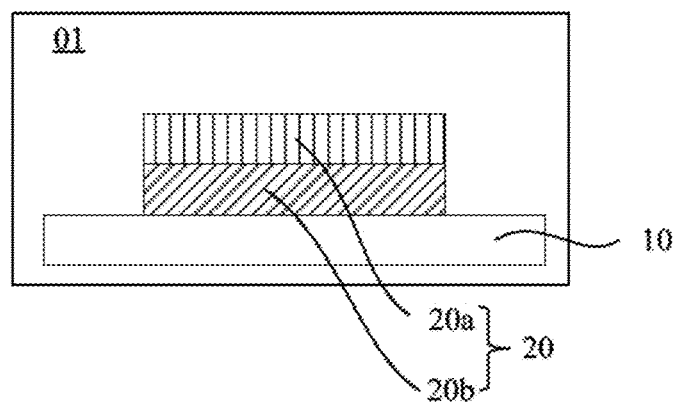
FIG. 8 is a schematic diagram illustrating a structure of a display substrate in some embodiment according to the present disclosure.

FIG. 8 is a schematic diagram illustrating a structure of a display substrate in some embodiment according to the present disclosure. Referring to FIG. 8, in some embodiments, the conductive layer 20 formed on a base substrate 10 includes a first sub-layer 20a, and a second sub-layer 20b. The second sub-layer 20b is disposed on a side of the base substrate 10. The first sublayer 20a is disposed on a side of the second sub-layer 20b away from the base substrate 10. Optionally, the first conductive sub-layer 20a is made of copper. Optionally, various appropriate conductive materials may be used to form the second sub-layer 20b, and the conductive materials may be used for forming the second sub-layer 20b include, but are not limited to copper, MoTi, and MoNb. In one example, the second sub-layer 20b is made of MoNb. In another example, the second sub-layer 20b is made of MoTi.

In another example, the conductive layer 20 includes multiple sub-layers. One of the multiple sub-layer forming an exposed surface of the conductive layer is made of copper.

In some embodiments, the conductive layer 20 can be formed in direct contact with the base substrate 10. Optionally, according to different designs of a display substrate 10, a layer other than the conductive layer is formed between the conductive layer 20 and the base substrate 10.

Figure 9:
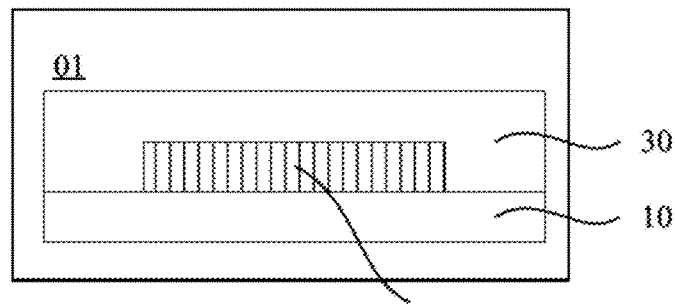
FIG. 9 is a schematic diagram illustrating a structure of a display substrate in some embodiment according to the present disclosure.
Figure 10:
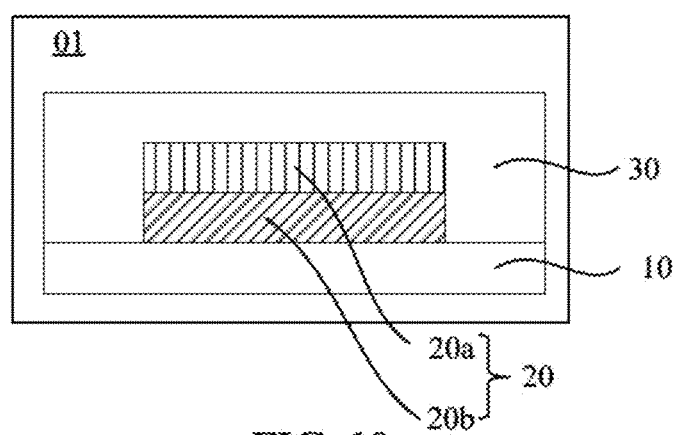
FIG. 10 is a schematic diagram illustrating a structure of a display substrate in some embodiment according to the present disclosure.

FIG. 9 is a schematic diagram illustrating a structure of a display substrate in some embodiment according to the present disclosure. FIG. 10 is a schematic diagram illustrating a structure of a display substrate in some embodiment according to the present disclosure. Referring to both FIG. 9 and FIG. 10, an oxide layer 30 is formed on a side of an exposed surface of the conductive layer 20 away from the base substrate 10 using chemical vapor deposition. Optionally, the oxide layer 30 covers all the exposed surface of the conductive layer 20, e.g., the oxide layer 30 encapsulates the conductive layer 20 on the base substrate 10. In on example, the oxide layer 30 covers an exposed top surface of the conductive layer 20. In another example, the oxide layer 30 covers an exposed top surface and an exposed lateral surface of the conductive layer 20. Optionally, an orthographic projection of the oxide layer 30 on the base substrate 10 covers an orthographic projection of the conductive layer 20 on the base substrate 10. Optionally, the orthographic projection of the oxide layer 30 on the base substrate 10 has a size equal or greater than the size of the orthographic projection of the conductive layer 20 on the base substrate 10.

Based on the method of fabricating a display substrate as described herein, by adjusting the parameters of the chemical vapor deposition, the conductive layer made of copper will not be oxidized by the oxide layer, or the chance of the conductive layer being oxidized by the oxide layer may be reduced, which will prevent the electrical performance from being affected and may expand the scope of the application of "the copper layer plus the oxide layer" design.

Figures 11, 12:
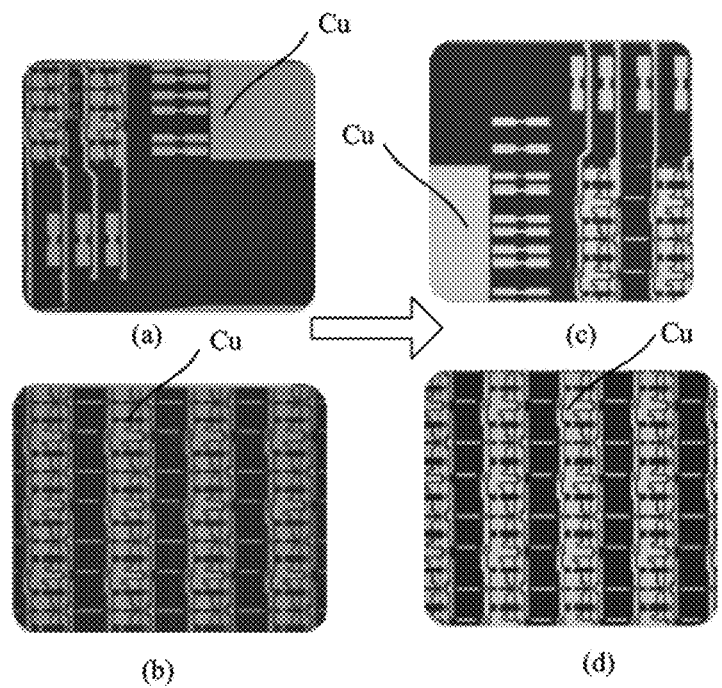
FIG. 11 is a schematic diagram illustrating differences between an oxidized copper layer and a non-oxidized copper layer of a display substrate in some embodiment according to the present disclosure.
FIG. 12 is a flow chart illustrating a method of fabricating a display substrate in some embodiments according to the present disclosure.

FIG. 11 is a schematic diagram illustrating differences between an oxidized copper layer and a non-oxidized copper layer of a display substrate in some embodiment according to the present disclosure. Referring to FIG. 11, a portion in grey color in FIG. 11 is conductive layer made of copper. Because a silicon oxide layer is thin and transparent, it cannot be observed in FIG. 11. Part (a) and part (c) show similar regions of display substrates. Part (b) and part (c) show similar regions of display substrates.

Referring to part (a) and part (b) of FIG. 11, when silicon oxide is directly deposited on a surface of a copper layer, the surface of the copper layer can be oxidized. Macroscopically, there are many dark spots on the surface of the copper layer.

Referring to part (c) and part (d) of FIG. 11, in some embodiments, using the method of fabricating a display substrate as described herein, the surface of the copper layer hasn't been oxidized. In some embodiments, using the method of fabricating a display substrate as described herein, the surface of the copper layer is only slightly oxidized. Macroscopically, the surface of the copper layer is smooth.

Comparing part (a) with part (c), the portion in grey color in part (c) is brighter than the portion in grey color in part (a), which means the surface of the copper layer in part (c) hasn't been oxidized (e.g. no dark spots) or has been only slightly oxidized. Comparing part (b) with part (d), the portion in grey color in part (d) is brighter than the portion in grey color in pan (b), which means the surface of the copper layer in part (d) hasn't been oxidized (e.g. no dark spots) or has been only slightly oxidized.

Figure 13:
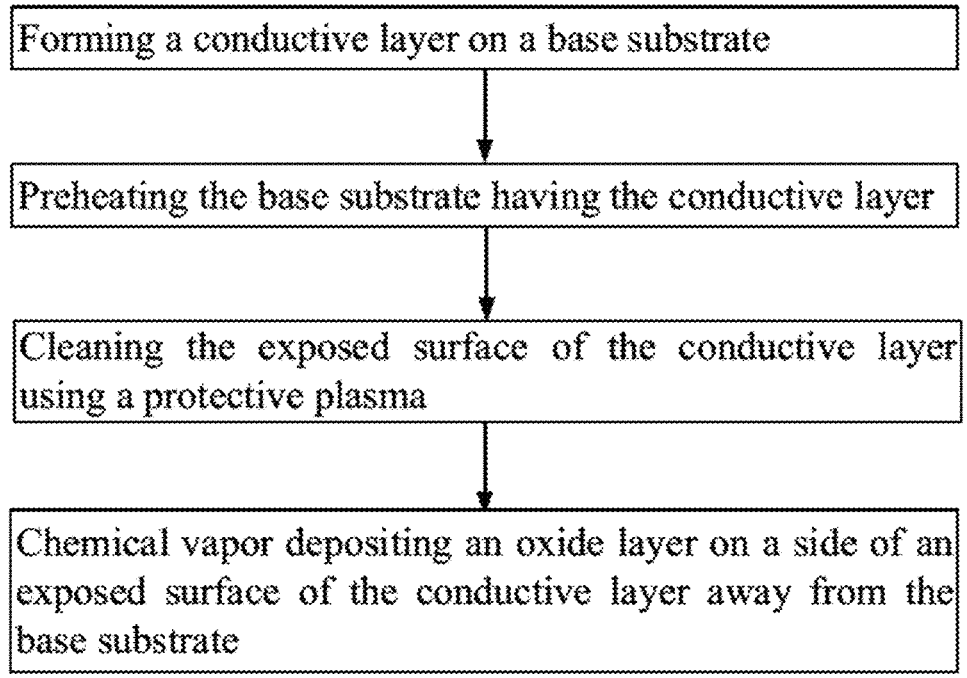
FIG. 13 is a flow chart illustrating a method of fabricating a display substrate in some embodiments according to the present disclosure.

FIG. 12 is a flow chart illustrating a method of fabricating a display substrate in some embodiments according to the present disclosure. FIG. 13 is a flow chart illustrating a method of fabricating a display substrate in some embodiments according to the present disclosure. Referring to both FIG. 12 and FIG. 13, in some embodiments, prior to performing the chemical vapor deposition process, the method of fabricating a display substrate includes cleaning the exposed surface of the conductive layer using a protective plasma. Optionally, cleaning the exposed surface of the conductive layer using the protective plasma is performed for a duration of 5 seconds to 30 seconds, e.g. 5 seconds to 10 second, 10 seconds to 15 second, 15 seconds to 20 second, and 25 seconds to 30 second.

Figure 14:
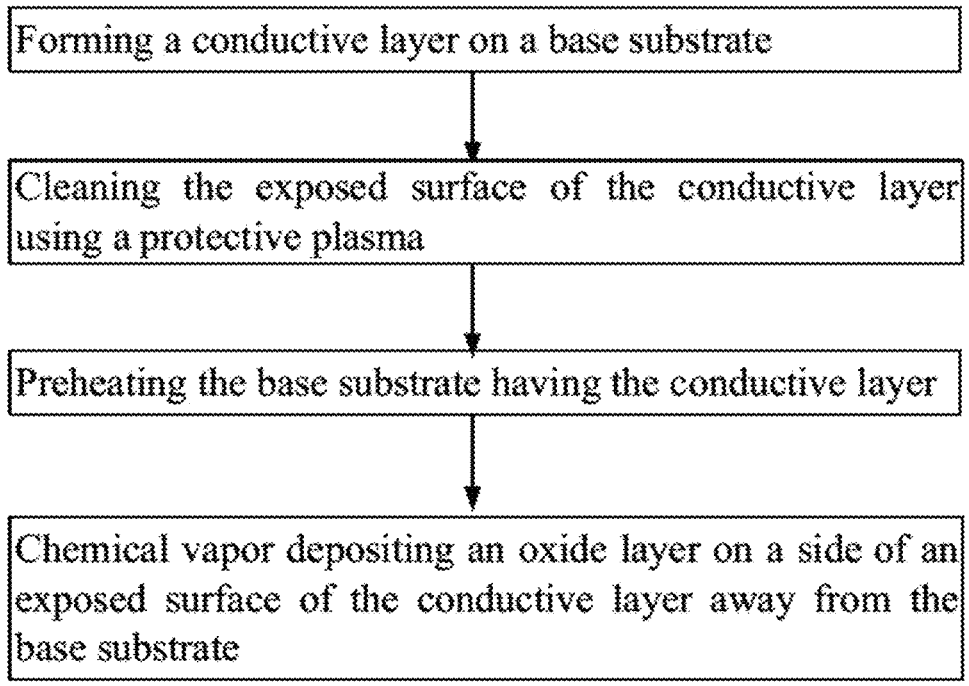
FIG. 14 is a flow chart illustrating a method of fabricating a display substrate in some embodiments according to the present disclosure.

Referring to FIG. 12, in one example, after forming a conductive layer on a base substrate, and prior to performing the chemical vapor deposition process of the oxide layer, cleaning the exposes surface of the conductive layer using a protective plasma can be performed. Referring to FIG. 13, in another example, after preheating the base substrate having the conductive layer, and prior to performing the chemical vapor deposition process of the oxide layer, cleaning the exposes surface of the conductive layer using a protective plasma can be performed. Referring to FIG. 14 which is a flow chart illustrating a method of fabricating a display substrate in some embodiments according to the present disclosure, in another example, after forming a conductive layer on a base substrate, and prior to preheating the base substrate having the conductive layer, cleaning the exposes surface of the conductive layer using a protective plasma can be performed. In another example, cleaning the exposes surface of the conductive layer using a protective plasma, and preheating the base substrate having the conductive layer can be performed at the same time.

By cleaning the exposed surface of the conductive layer using a protective plasma, the impurity including water and organic materials on the surface of the conductive layer may be removed, which may improve the interface characteristics of the conductive layer, and enhance the adhesion between the conductive layer and the oxide layer subsequently deposited.

Various appropriate materials may be used as the protective plasma. Examples of materials suitable for being the protective plasma include, but are not limited to, nitrogen, argon, or a combination of nitrogen and argon.

In some embodiments, the flow of the protective plasma includes the protective gas is in a range of 30000 sccm to 50000 sccm, e.g. 30000 sccm to 35000 sccm, 35000 sccm to 40000 sccm, 40000 sccm to 45000 sccm, and 45000 sccm to 50000 sccm.

In some embodiments, the display substrate is an array substrate. The conductive layer is a layer selected from a group consisting of a gate electrode of a thin film transistor, a gate line, a source electrode of a thin film transistor, a drain electrode of a thin film transistor, a data line, and a common electrode signal line. Optionally, there can be a plurality of conductive layer. Accordingly, the oxide layer can be a respective one of the plurality of oxide layers covering one of or a combination of a gate electrode, a gate line, a source electrode, a drain electrode, a data line, and a common electrode signal line.

Figure 15:
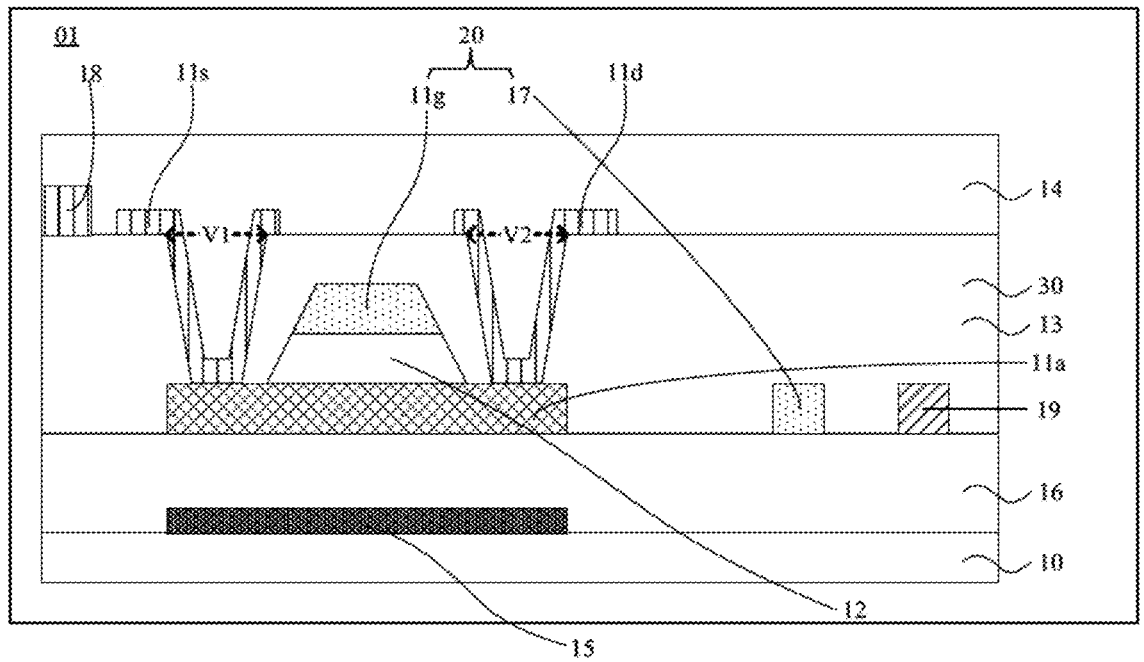
FIG. 15 is a cross-sectional view of a display substrate in some embodiments according to the present disclosure.
Figure 16:
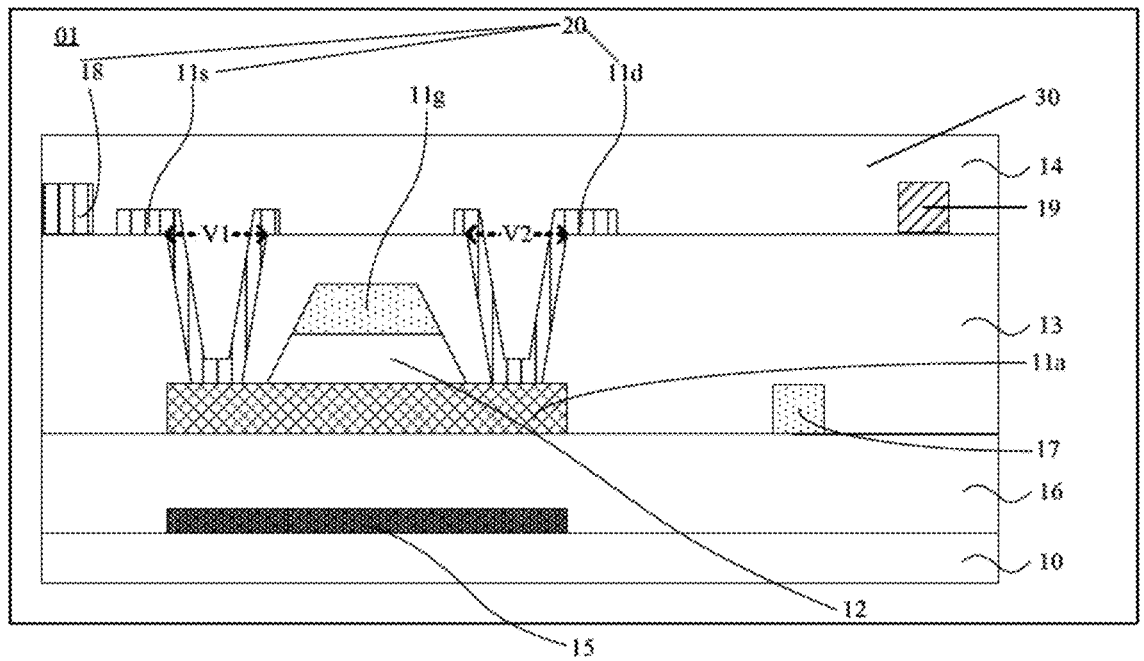
FIG. 16 is a cross-sectional view of a display substrate in some embodiments according to the present disclosure.

FIG. 15 is a cross-sectional view of a display substrate in some embodiments according to the present disclosure. FIG. 16 is a cross-sectional view of a display substrate in some embodiments according to the present disclosure. Referring to both FIG. 15 and FIG. 16, in some embodiments, in an array substrate, the gate electrode 11g and the gate line 17 are formed in a same layer. The source electrode 11s, the drain electrode Id, and the data line 18 are formed in a same layer. The gate electrode 11g and gate line 17 are in a layer different from the layer having the source electrode 11s, the drain electrode 11d, and the data line 18. The common electrode signal line 19 can be formed in the layer having gate line 17 (as shown in FIG. 15) or in the layer having data line 18 (as shown in FIG. 16).

In one example, referring to FIG. 15, the conductive layer 20 includes a gate electrode 11g, and a gate line 17, the oxide layer 30 is an insulating layer covering the gate electrode 11g and the gate line 17. In another example, referring to FIG. 16, the conductive layer 20 includes a source electrode 11s, a drain electrode 11d, and a date line 18, the oxide layer 30 is an insulating layer covering the source electrode 11s, the drain electrode 11d, and the date line 18.

The layer including a gate electrode 11g, and a gate line 17 is called Gate layer. The layer including a source electrode 11s, a drain electrode 11d, and a date line 18 is called SD layer. An insulating layer covering the Gate layer can be formed using a method of fabricating a display substrate described herein. An insulating layer covering the SD layer can be formed using a method of fabricating a display substrate described herein.

In some embodiments, the display substrate 10 is an array substrate. Optionally, the army substrate includes a top gate ET. Referring to FIG. 15, the conductive layer 20 includes a gate electrode 11g and a gate line 17 connected to the gate electrode 11g. The gate electrode 11g and the gate line 17 are formed in a same layer. The oxide layer 30 includes an inter-layer dielectric layer 13 in direct contact with the gate electrode 11g and the gate line 17.

Optionally, the method of fabricating a display substrate includes forming a conductive layer 20 on a base substrate, and performing a chemical vapor deposition process of an oxide layer 30 on a side of an exposed surface of the conductive layer 20 away from the base substrate.

Prior to forming a conductive layer 20 on a base substrate 10, the method further includes forming an active layer 11a on the base substrate 10; and forming a gate insulating layer 12 on a side of the active layer h a away from the base substrate 10.

Optionally, forming a conductive layer 20 on the base substrate 10 includes forming a gate electrode 11g and a gate line 17 connected to the gate electrode 11g, on a side of the gate insulating layer 12 away from the base substrate 10. The conductive layer 20 includes the gate electrode 11g and the gate line 17.

Optionally, performing the chemical vapor deposition process of an oxide layer 30 on a side of an exposed surface of the conductive layer 20 away from the base substrate includes forming an inter-layer dielectric (ILD) layer 13 on a side of the gate electrode 11g and the gate line 17 away from the base substrate 10. For example, the oxide layer 30 includes the inter-layer dielectric layer 13. The inter-layer dielectric layer 13 is formed using the method described in herein.

Subsequent to forming the oxide layer 30, the method further includes forming a first via V1 and a second via V2 respectively extending through the oxide layer 30 to expose a surface of the active layer 11a; forming a source electrode 11s, a drain electrode 11d, and a data line 18 connected to the source electrode 11s, on a side of the oxide layer 30 away from the active layer 11a. For example, the source electrode 11s is connected to the active layer 11a through the first via V1, and the drain electrode 11d is connected to the active layer 11a through the second via V2.

Optionally, the method further includes forming a protective layer 14 (e.g. passivation layer, PVX) on a side of the source electrode 11s, the drain electrode 11d, and the data line 18, away from the base substrate 10.

For example, the inter-layer dielectric layer 13 is in direct contact with the active layer 11a. Optionally, the active layer 11a is an oxide semiconductor active layer, for example, the active layer 11a is formed using oxide semiconductor including Indium Gallium Zinc Oxide (IGZO). The active layer 11a obtaining IGZO is relatively sensitive to hydrogen. When the inter-layer dielectric layer 13 is made of materials including silicon nitride (SiNy), during the process of forming the inter-layer dielectric layer 13 using materials including silicon nitride (SiNy), more hydrogen is introduced into the inter-layer dielectric layer 13, which may affect the channel characteristics of the active layer 11a when the TFT is turned on. By using the method described herein, forming the inter-layer dielectric layer 13 can not only provide an insulating layer to the active layer 11a to avoid introducing more hydrogen, but also prevent the copper surface of gate electrode 11g and the copper surface of gate line 17 from being oxidized even in a reaction condition of chemical vapor deposition having high temperature and oxygen.

In some embodiments, the display substrate 10 is an array substrate. Optionally, the array substrate includes a top gate TFT. Referring to FIG. 16, the conductive layer 20 includes a source electrode 11s, a drain electrode 11d, and a data line 18 connected to the source electrode 11s. The source electrode 11s, the drain electrode 11d, and the data line 18 is formed in a same layer. The oxide layer 30 includes a protective layer 14 in direct contact with the source electrode 11s, the drain electrode 11d, and the data line 18.

Optionally, the method of fabricating a display substrate includes forming a conductive layer 20 on a base substrate, and performing a chemical vapor deposition process of an oxide layer 30 on a side of an exposed surface of the conductive layer 20 away from the base substrate.

Prior to forming the conductive layer 20, the method includes forming an active layer 11a on the base substrate 10; forming a gate insulating layer 12 on a side of the active 11a away from the base substrate 10; forming a gate electrode 11g and a gate line 17 connected to the gate electrode 11g on a side of the gate insulating layer 12 away from the base substrate 10; forming an inter-layer dielectric layer 13 on a side of the active layer 11a, the gate electrode 11g, and the gate line 17, away from the base substrate 10; and forming a first via V1 and a second via V2 respectively extending through the inter-layer dielectric layer 13 to expose a surface of the active layer.

Optionally, forming a conductive layer 20 on the base substrate 10 includes forming the source electrode 11s, the drain electrode 11d, and the data line 18, on a side of the inter-layer dielectric layer 13 away from the base substrate 10. For example, the source electrode 11s is connected to the active layer 11a through the first via V1, and the drain electrode 11d is connected to the active layer 11a through the second V2. The conductive layer 20 includes the source electrode 11s, the drain electrode 11d, and the data line 18.

Optionally, performing the chemical vapor deposition process of an oxide layer 30 on a side of an exposed surface of the conductive layer 20 away from the base substrate includes forming the protective layer 14 on a side of the source electrode 11s, the drain electrode 11d, and the date line 18. Optionally, the protective layer 14 is the oxide layer 30 formed using the method described herein. In a reaction condition of chemical vapor deposition having high temperature and oxygen, the method described herein may prevent the copper surface of the source electrode 11s, drain electrode 11d and the data line 18 from being oxidized.

In some embodiments, referring to both FIG. 15 and FIG. 16, the conductive layer 20 includes the gate electrode 11g, the gate line 17, the source electrode 11s, the drain electrode 11d, and the data line 18. The oxide layer 30 includes the inter-layer dielectric layer 13, and the protective layer 14.

In some embodiments, the conductive layer may be different layer in a display substrate. The oxide layer is a layer covering a respective conductive layer. In one example, the oxide layer is the dielectric layer 13. In another example, the oxide layer is the protective layer 14. The dielectric layer 13 and the protective layer 14 are formed using the method described herein.

For example, the inter-layer dielectric layer 13 is in direct contact with the active layer 11a. Optionally, the active layer 11a is an oxide semiconductor active layer, for example, the active layer 11a is formed using oxide semiconductor including Indium Gallium Zinc Oxide (IGZO). The active layer 11a obtaining IGZO is relatively sensitive to hydrogen. When the inter-layer dielectric layer 13 is made of materials including silicon nitride (SiNy), during the process of forming the inter-layer dielectric layer 13 using materials including silicon nitride (SiNy), more hydrogen is introduced into the inter-layer dielectric layer 13, which may affect the channel characteristics of the active layer 11a when the TFT is turned on. By using the method described herein, forming the inter-layer dielectric layer 13 can not only provide an insulating layer to the active layer 11a to avoid introducing more hydrogen, but also prevent the copper surface of gate electrode 11g and the copper surface of gate line 17 from being oxidized even in a reaction condition of chemical vapor deposition having high temperature and oxygen.

In some embodiments, referring to both FIG. 15 and FIG. 16, in the top gate TFT, an orthographic projection of the gate electrode 11g on the base substrate 10 has a size smaller than a size of an orthographic projection of the active layer 11a on the base substrate 10. The active layer 11a has a source electrode contacting region, and a drain electrode contracting region. The first via V1 and the second via V2 can extend through the inter-layer dielectric layer 13 to expose the surface of the active layer 11a.

In some embodiments, the gate insulating layer 12 covers the active layer 11a, for example, the orthographic projection of the gate insulating layer 12 covers the orthographic projection of the active layer 11a. The first via V1 and the second via V2 should extend through the inter-layer dielectric layer 13 and the gate insulating layer 12 to expose the surface of the active layer 11a.

In some embodiments, prior to forming the active layer 11a, the gate insulating layer 12 on the base substrate 10, a light shield layer 15 is formed on the base substrate 10 corresponding to the active layer 11a. The light shield layer 15 is formed to prevent light from transmitting to the active layer and causing current leakage.

In some embodiments, a buffer layer 16 is formed on a side of the light shield layer 15 away from the base substrate 10. An orthographic projection of the buffer layer 16 on the base substrate 10 covers an orthographic projection of the light shield layer 15 on the base substrate 10. The active layer is formed on a side of the buffer layer 16 away from the base substrate.

In some embodiments, the display substrate is an array substrate. Optionally, the array substrate includes a bottom gate TFT. The conductive layer includes a gate electrode and a gate line connected to the gate electrode. The gate electrode and the gate line are formed in a same layer. The oxide layer includes a gate insulating layer in direct contact with the gate electrode and the gate line.

Optionally, the method of fabricating a display substrate includes forming a conductive layer on a base substrate, and performing a chemical vapor deposition process of an oxide layer on a side of an exposed surface of the conductive layer away from the base substrate.

Optionally, forming a conductive layer on the base substrate includes forming a gate electrode and a gate line connected to the gate electrode on the base substrate. The conductive layer includes the gate electrode and the gate line.

Optionally, performing the chemical vapor deposition process of an oxide layer on a side of an exposed surface of the conductive layer away from the base substrate includes forming a gate insulating layer on a side of the gate electrode and the gate line away from the base substrate. For example, the oxide layer includes the gate insulating layer.

Subsequent to forming the oxide layer, the method further includes forming an active layer on a side of the gate insulating layer away from the base substrate; forming a source electrode, a drain electrode, and a data line on a side of the active layer away from the base substrate; and forming a protective layer on a side of the source electrode, the drain electrode, and the data line away from the based substrate.

In some embodiments, the display substrate is an array substrate. Optionally, the array substrate includes a bottom gate TFT. The conductive layer includes a gate electrode and a gate line connected to the gate electrode. The gate electrode and the gate line are formed in a same layer. The oxide layer includes a gate insulating layer in direct contact with the gate electrode and the gate line.

Optionally, the method of fabricating a display substrate includes forming a conductive layer on a base substrate, and performing a chemical vapor deposition process of an oxide layer on a side of an exposed surface of the conductive layer away from the base substrate.

Optionally, forming a conductive layer on the base substrate includes forming agate electrode and a gate line connected to the gate electrode on the base substrate. The conductive layer includes the gate electrode and the gate line.

Optionally, performing the chemical vapor deposition process of an oxide layer on a side of an exposed surface of the conductive layer away from the base substrate includes forming a gate insulating layer on a side of the gate electrode and the gate line away from the base substrate. For example, the oxide layer includes the gate insulating layer.

Subsequent to forming the oxide layer, the method further includes forming an active layer on a side of the gate insulating layer away from the base substrate; forming an inter-layer dielectric layer on a side of the active layer; forming a first via and a second via respectively extending through the inter-layer dielectric layer to expose a surface of the active layer; forming a source electrode, a drain electrode, and a data line on a side of the inter-layer dielectric layer away from the base substrate; and forming a protective layer on a side of the source electrode, the drain electrode, and the data line away from the based substrate. For example, the source electrode is connected to the active layer through the first via, and the drain electrode is connected to the active layer through the second.

In some embodiments, the display substrate is an array substrate. Optionally, the array substrate includes a bottom gate TFT. The conductive layer includes a source electrode, a drain electrode, and a data line connected to the source electrode. The gate electrode and the gate line are formed in a same layer. The oxide layer includes protective layer in direct contact with the source electrode, the drain electrode, and the data line.

Optionally, the method of fabricating a display substrate includes forming a conductive layer on a base substrate, and performing a chemical vapor deposition process of an oxide layer on a side of an exposed surface of the conductive layer away from the base substrate.

Prior to forming a conductive layer on abase substrate, the method further includes forming a gate electrode on the base substrate; forming a gate insulating layer on a side of the gate electrode away from the base substrate; and forming an active layer on a side of the gate insulating layer away from the base substrate.

Optionally, forming a conductive layer on abase substrate includes forming a source electrode, a drain electrode, and a data line on a side of the active layer away from the base substrate. The conductive layer includes the source electrode, the drain electrode, and the data line.

Optionally, performing the chemical vapor deposition process of an oxide layer on a side of an exposed surface of the conductive layer away from the base substrate includes forming a protective layer on a side of the source electrode, the drain electrode, and the data line away from the base substrate. For example, the oxide layer includes the protective layer.

In some embodiments, the display substrate is an array substrate. Optionally, the array substrate includes a bottom gate TET. The conductive layer includes a source electrode, a drain electrode, and a data line connected to the source electrode. The gate electrode and the gate line are formed in a same layer. The oxide layer includes protective layer in direct contact with the source electrode, the drain electrode, and the data line.

Optionally, the method of fabricating a display substrate includes forming a conductive layer on a base substrate, and performing a chemical vapor deposition process of an oxide layer on a side of an exposed surface of the conductive layer away from the base substrate.

Prior to forming a conductive layer on abase substrate, the method further includes forming a gate electrode on the base substrate; forming a gate insulating layer on a side of the gate electrode away from the base substrate; forming an active layer on a side of the gate insulating layer away from the base substrate; forming an inter-layer dielectric layer on a side of the active layer away from the base substrate; and forming a first via and a second via respectively extending through the inter-layer dielectric layer to expose a surface of the active layer.

Optionally, forming a conductive layer on a base substrate includes forming a source electrode, a drain electrode, and a data line on a side of the active layer away from the base substrate. For example, the source electrode is connected to the active layer through the first via, and the drain electrode is connected to the active layer through the second. The conductive layer includes the source electrode, the drain electrode, and the data line.

Optionally, performing the chemical vapor deposition process of an oxide layer on a side of an exposed surface of the conductive layer away from the base substrate includes forming a protective layer on a side of the source electrode, the drain electrode, and the data line away from the base substrate. For example, the oxide layer includes the protective layer.

In some embodiments, the conductive layer includes the gate electrode, the gate line, the source electrode, the drain electrode, and the data line. The oxide layer includes gate insulating layer, and the protective layer 14.

In another aspect, the present disclosure also provides a display substrate. In some embodiments, a display substrate is fabricated by a method including forming a conductive layer on a base substrate; and performing a chemical vapor deposition process of an oxide layer on a side of an exposed surface of the conductive layer away from the base substrate, the exposed surface of the conductive layer including copper, the oxide layer formed to include an oxide of a target element M. Optionally, the chemical vapor deposition process of the oxide layer is performed using a mixture of a first reaction gas including oxygen and a second reaction gas including the target element M, at a reaction temperature in a range of 200 degrees to 280 degrees. Optionally, a mole ratio of oxygen element to the target element M in the mixture of the first reaction gas and the second reaction gas is in a range of 40:1 to 60:1.

Optionally, prior to performing the chemical vapor deposition process of the oxide layer, the base substrate having the conductive layer is no pre-heated.

Optionally, prior to performing the chemical vapor deposition process of the oxide layer, further including pre-heating the base substrate having the conductive layer for a duration no more than 5 seconds.

Optionally, the chemical vapor deposition process of the oxide layer is performed at a power in a range of 4 kw to 12 kw, and at an atmosphere pressure in a range of 0.7 mtorr to 1.3 mtorr.

Optionally, prior to performing the chemical vapor deposition process of the oxide layer, further includes cleaning the exposed surface of the conductive layer using a protective plasma. In one example, cleaning the exposed surface of the conductive layer using the protective plasma is performed for a duration in a range of 5 seconds to 30 seconds. In another example, the protective plasma includes nitrogen, argon, or a combination of nitrogen and argon. In another example, a flow of the protective plasma includes the protective gas is in a range of 30000 sccm to 50000 sccm Optionally, the target element M is silicon, and the oxide layer includes $SiO_x$, $0<x\le 2$.

Optionally, the first reaction gas includes $N_2O$, and the second reaction gas includes $SiH_4$.

In some embodiments, the conductive layer is a layer selected from a group consisting of a gate electrode of a thin film transistor, a gate line, a source electrode of a thin film transistor, a drain electrode of a thin film transistor, a data line, and a common electrode signal line.

Optionally, the conductive layer includes a gate electrode and a gate line connected to the gate electrode, the gate electrode and the gate line formed in a same layer. The oxide layer includes an inter-layer dielectric layer in direct contact with the gate electrode and the gate line.

For example, prior to forming the conductive layer, the method further includes forming an active layer on the base substrate; and forming a gate insulating layer on a side of the active layer away from the base substrate. Subsequent to forming the oxide layer, the method further includes forming a first via and a second via respectively extending through the oxide layer to expose a surface of the active layer; forming a source electrode, a drain electrode, and a data line connected to the source electrode, on a side of the oxide layer away from the active layer; forming a protective layer on a side of the source electrode, the drain electrode, and the data line, away from the base substrate. The source electrode is connected to the active layer through the first via, and the drain electrode is connected to the active layer through the second via.

Optionally, the conductive layer includes a source electrode, a drain electrode, and a data line connected to the source electrode, the source electrode, the drain electrode, and the data line formed in a same layer; and the oxide layer includes a protective layer in direct contact with the source electrode, the drain electrode, and the data line.

For example, prior to forming the conductive layer, the method further includes forming an active layer on the base substrate; and forming a gate insulating layer on a side of the active layer away from the base substrate; forming a gate electrode and a gate line connected to the gate electrode on a side of the gate insulating layer away from the base substrate; forming an inter-layer dielectric layer on a side of the active layer, the gate electrode, and the gate line, away from the base substrate; and forming a first via and a second via respectively extending through the inter-layer dielectric layer to expose a surface of the active layer. Forming the conductive layer includes forming the source electrode, the drain electrode, and the data line, on a side of the inter-layer dielectric layer away from the base substrate. The source electrode is connected to the active layer through the first via, and the drain electrode is connected to the active layer through the second via.

Optionally, forming the conductive layer includes forming a first sub-layer and forming a second sub-layer on a side of the first sub-layer away from the base substrate. The exposed surface of the conductive layer is an exposed surface of the second sub-layer. The second sub-layer is formed to include copper. The first sub-layer includes a Molybdenum-Niobium alloy or a Molybdenum-Titanium alloy.

In another aspect, the present disclosure also provides a display panel containing the display substrate described herein. Optionally, the display panel is a liquid crystal display panel. Optionally, the display panel is an organic light emitting diode display panel.

In another aspect, the present disclosure also provides a display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display substrate, comprising:
    forming a conductive layer on a base substrate; and
    performing a chemical vapor deposition process to form an oxide layer on a side of an exposed surface of the conductive layer away from the base substrate, the exposed surface of the conductive layer comprising copper, the oxide layer formed to comprise an oxide of a target element M;
    wherein the chemical vapor deposition process is performed using a mixture of a first reaction gas comprising oxygen and a second reaction gas comprising the target element M, at a reaction temperature in a range of 200 Celsius degrees to 280 Celsius degrees; and
    a mole ratio of oxygen element to the target element M in the mixture of the first reaction gas and the second reaction gas is greater than 40:1 and less than 50:1.

2. The method of claim 1, wherein prior to performing the chemical vapor deposition process, the base substrate having the conductive layer is not pre-heated.

3. The method of claim 1, prior to performing the chemical vapor deposition process, further comprising pre-heating the base substrate having the conductive layer for a duration no more than 5 seconds.

4. The method of claim 1, wherein the chemical vapor deposition process is performed at a power in a range of 4 kw to 12 kw, and at an atmosphere pressure in a range of 0.7 mtorr to 1.3 mtorr.

5. The method of claim 1, prior to performing the chemical vapor deposition process, further comprising cleaning the exposed surface of the conductive layer using a protective plasma.

6. The method of claim 5, wherein cleaning the exposed surface of the conductive layer using the protective plasma is performed for a duration in a range of 5 seconds to 30 seconds.

7. The method of claim 5, wherein the protective plasma comprises nitrogen, argon, or a combination of nitrogen and argon.

8. The method of claim 5, wherein a flow of the protective plasma comprises the protective gas is in a range of 30000 sccm to 50000 sccm.

9. The method of claim 1, wherein the target element M is silicon, and the oxide layer comprises $SiO_x$, $0<x\leq2$.

10. The method of claim 1, wherein the first reaction gas comprises $N_2O$, and the second reaction gas comprises $SiH_4$.

11. The method of claim 1, wherein the conductive layer is a layer selected from a group consisting of a gate electrode of a thin film transistor, a gate line, a source electrode of a thin film transistor, a drain electrode of a thin film transistor, a data line, and a common electrode signal line.

12. The method of claim 1, wherein the conductive layer comprises a gate electrode and a gate line connected to the gate electrode, the gate electrode and the gate line formed in a same layer; and the oxide layer comprises an inter-layer dielectric layer in direct contact with the gate electrode and the gate line.

13. The method of claim 1, wherein the conductive layer comprises a source electrode, a drain electrode, and a data line connected to the source electrode, the source electrode, the drain electrode, and the data line formed in a same layer; and the oxide layer comprises a protective layer in direct contact with the source electrode, the drain electrode, and the data line.

14. The method of claim 1, wherein forming the conductive layer comprises forming a first sub-layer and forming a second sub-layer on a side of the first sub-layer away from the base substrate, the exposed surface of the conductive layer being an exposed surface of the second sub-layer;

the second sub-layer is formed to comprise copper; and the first sub-layer comprises a Molybdenum-Niobium alloy or a Molybdenum-Titanium alloy.

15. A display substrate fabricated by a method of claim 1.

16. A display apparatus, comprising the display substrate of claim 15, and one or more integrated circuits connected to the display substrate.

* * * * *